(12) United States Patent
Surthi

(10) Patent No.: US 8,667,928 B2
(45) Date of Patent: Mar. 11, 2014

(54) SEMICONDUCTOR PROCESSING

(75) Inventor: Shyam Surthi, Boise, ID (US)

(73) Assignee: Micron Technology, Inc., Boise, ID (US)

(*) Notice: Subject to any disclaimer, the term of this patent is extended or adjusted under 35 U.S.C. 154(b) by 380 days.

(21) Appl. No.: 13/086,133

(22) Filed: Apr. 13, 2011

(65) Prior Publication Data

US 2011/0185970 A1 Aug. 4, 2011

Related U.S. Application Data

(62) Division of application No. 11/891,575, filed on Aug. 10, 2007, now Pat. No. 7,928,019.

(51) Int. Cl.
*H01L 21/00* (2006.01)
(52) U.S. Cl.
USPC ............................ 118/704; 118/722; 118/715
(58) Field of Classification Search
USPC .......................................... 118/704, 722, 715
See application file for complete search history.

(56) References Cited

U.S. PATENT DOCUMENTS

| | | | |
|---|---|---|---|
| 5,755,886 A * | 5/1998 | Wang et al. | 118/715 |
| 5,871,811 A * | 2/1999 | Wang et al. | 427/248.1 |
| 6,364,954 B2 * | 4/2002 | Umotoy et al. | 118/715 |
| 6,429,152 B1 | 8/2002 | Yang et al. | |
| 6,435,865 B1 | 8/2002 | Tseng et al. | |
| 6,585,823 B1 | 7/2003 | Van Wijck | |
| 6,803,546 B1 * | 10/2004 | Boas et al. | 219/390 |
| 6,828,218 B2 | 12/2004 | Kim et al. | |
| 6,902,763 B1 * | 6/2005 | Elers et al. | 427/250 |
| 6,929,699 B2 | 8/2005 | Whitesell | |
| 7,007,933 B2 * | 3/2006 | Lee et al. | 261/121.1 |
| 7,056,806 B2 | 6/2006 | Basceri et al. | |
| 7,060,514 B2 | 6/2006 | Mercaldi et al. | |
| 7,105,441 B2 | 9/2006 | Derderian et al. | |
| 7,112,544 B2 | 9/2006 | Doan et al. | |
| 7,115,528 B2 | 10/2006 | Vaartstra et al. | |
| 7,118,783 B2 | 10/2006 | Carpenter et al. | |
| 7,128,787 B2 | 10/2006 | Castovillo et al. | |
| 7,169,713 B2 | 1/2007 | Wu et al. | |
| 7,183,208 B2 | 2/2007 | Doan et al. | |
| 7,199,023 B2 | 4/2007 | Ahn et al. | |
| 7,294,202 B2 * | 11/2007 | Chen et al. | 117/94 |

(Continued)

FOREIGN PATENT DOCUMENTS

| | | |
|---|---|---|
| JP | 07-249584 A | 9/1995 |
| KR | 2003-0090463 A | 11/2003 |

OTHER PUBLICATIONS

Baek, Yang Gyu, International Search report from related PCT application mailed Mar. 12, 2009 (3 pgs.).

*Primary Examiner* — Laura Menz
(74) *Attorney, Agent, or Firm* — Brooks, Cameron & Huebsch, PLLC

(57) ABSTRACT

Embodiments of the present disclosure include semiconductor processing methods and systems. One method includes forming a material layer on a semiconductor substrate by exposing a deposition surface of the substrate to at least a first and a second reactant sequentially introduced into a reaction chamber having an associated process temperature. The method includes removing residual first reactant from the chamber after introduction of the first reactant, removing residual second reactant from the chamber after introduction of the second reactant, and establishing a temperature differential substantially between an edge of the substrate and a center of the substrate via a purge process.

9 Claims, 7 Drawing Sheets

(56) References Cited

U.S. PATENT DOCUMENTS

| | | | |
|---|---|---|---|
| 7,582,544 B2 * | 9/2009 | Gunji et al. | 438/478 |
| 7,928,019 B2 * | 4/2011 | Surthi | 438/770 |
| 2004/0058560 A1 * | 3/2004 | Ranish et al. | 438/795 |
| 2005/0098107 A1 * | 5/2005 | Du Bois et al. | 118/715 |
| 2006/0029792 A1 * | 2/2006 | Chen et al. | 428/323 |
| 2006/0090694 A1 | 5/2006 | Cho et al. | |
| 2006/0292841 A1 | 12/2006 | Quick | |
| 2007/0065578 A1 | 3/2007 | McDougall | |
| 2007/0084406 A1 | 4/2007 | Yudovsky et al. | |
| 2007/0134919 A1 * | 6/2007 | Gunji et al. | 438/680 |
| 2007/0193637 A1 * | 8/2007 | Cantin et al. | 137/606 |
| 2009/0042404 A1 * | 2/2009 | Surthi | 438/770 |
| 2009/0176379 A1 * | 7/2009 | Surthi | 438/778 |
| 2009/0283038 A1 * | 11/2009 | Gunji et al. | 118/722 |
| 2011/0185970 A1 * | 8/2011 | Surthi | 118/704 |

* cited by examiner

SEMICONDUCTOR PROCESSING

PRIORITY APPLICATION INFORMATION

This application is a Divisional of U.S. application Ser. No. 11/891,575, filed Aug. 10, 2007, the specification of which are incorporated herein by reference.

TECHNICAL FIELD

The present disclosure relates generally to semiconductor processing and, more particularly, to semiconductor processing via atomic layer deposition (ALD) and/or chemical vapor deposition (CVD).

BACKGROUND

During semiconductor device fabrication, layers of materials are formed over semiconductor substrates, e.g., wafers. Among the materials which can be included in such layers are tantalum pentoxide, titanium nitride, titanium silicon nitride, tantalum nitride, tantalum silicon nitride, titanium silicide, tantalum silicide, tungsten nitride, aluminum oxide, hafnium oxide, zirconium oxide, silicon nitride, silicon dioxide, elemental tungsten and elemental titanium. Methods for forming layers of such materials can include chemical vapor deposition (CVD) and atomic layer deposition (ALD).

Chemical vapor deposition includes mixing two or more reactants in a chamber to form a material which subsequently deposits across exposed surfaces of one or more semiconductor substrates. In CVD processes, it can be difficult to control reactions between the reactants provided in the chamber and various side-reactions can occur which can generate contaminants. Additionally, it can be difficult to form a uniform layer over multiple exposed surfaces of one or more semiconductor substrates with CVD. The deposition of CVD material can be faster in various regions of semiconductor topography than other regions, which can lead to within wafer (WIW) non-uniformity, e.g., increased WIW uniformity variance in a thickness of the deposited material across various exposed surfaces of semiconductor substrates provided within a CVD reaction chamber.

Atomic layer deposition (ALD) can overcome some of the problems discussed above relative to CVD. ALD processing includes forming thin films of material by repeatedly depositing monoatomic layers. The technique involves individually depositing reactants, e.g., precursors, that react in situ to form a desired film of material across a semiconductor substrate. More specifically, ALD processes involve introduction of a first reactant which reacts with a substrate to form a monolayer across the substrate. The first reactant will often react with the substrate, but not with itself. Accordingly, side-reactions can be reduced or eliminated. Further, the reaction of the reactant with the substrate can be self-limiting, e.g., once a monolayer forms across exposed surfaces of the substrate there is no longer further reaction of the reactant with the substrate.

In ALD processes, after the monolayer is formed, the excess first reactant can be evacuated from the reaction chamber via a purge process, and a second reactant can be subsequently introduced. A purge process can include one or more purge steps in which a purge gas, e.g., an inert gas, is introduced into the reaction chamber and one or more pumping steps preceding and/or following introduction of the purge gas to remove excess reactant, catalyst, purge gas, and/or by-product gases from the chamber.

In ALD processes, the second reactant reacts with the monolayer of material formed from the first reactant to convert such monolayer into a desired material layer over the substrate. The desired material layer can have a relatively uniform thickness across the various surfaces of the substrate, which can be made thicker by evacuating the second reactant from the processing chamber via a purge process and repeating the above-described process until a desired thickness of the desired material layer is formed.

Depending on the reactant system and with long enough pump and/or purge times, an ALD process can produce very uniform thickness across a wafer regardless of topography and can maintain uniform thickness profiles for each wafer in a batch if the processing temperature is held constant. However, the layer by layer ALD processing can have significantly lower throughput as compared to CVD processing techniques. To improve the throughput associated with ALD processes, the purge process can be shortened by using shorter pump and/or purge times between reactant pulses. In some cases, the deposition rate associated with ALD processing can be improved by increasing or decreasing the process temperature. Also, ALD throughput can be improved by processing a plurality of wafers simultaneously in a batch process.

However, performing batch processes, increasing or decreasing the process temperature, and/or shortening pump and/or purge times can lead to an added CVD component associated with an ALD process. An ALD process having an added CVD component refers to a quasi-ALD process which exhibits some CVD process characteristic, such as increased direct reactions between residual reactants and/or other CVD process characteristics, which can increase the WIW uniformity variance associated with the deposition process. For example, performing batch processes, increasing or decreasing the process temperature, and/or shortening the pump and/or purge time, e.g., the time used to evacuate the chamber between ALD reactant pulses, can lead to incomplete removal of the ALD reactants and thereby increases contaminants and/or co-reactions within the chamber.

DETAILED DESCRIPTION

Embodiments of the present disclosure include semiconductor processing methods and systems. Various embodiments can improve the throughput of an atomic layer deposition (ALD) process by controlling and/or compensating for one or more chemical vapor deposition (CVD) components associated with the ALD process.

One method includes forming a material layer on a semiconductor substrate by exposing a deposition surface of the substrate to at least a first and a second reactant sequentially introduced into a reaction chamber having an associated process temperature. The method includes removing residual first reactant from the chamber after introduction of the first reactant, removing residual second reactant from the chamber after introduction of the second reactant, and establishing a temperature differential substantially between an edge of the substrate and a center of the substrate via a purge process.

As used herein the terms "wafer" and "substrate" may include a number of semiconductor-based structures that have an exposed semiconductor surface. Structure can be understood to include silicon, silicon-on-insulator (SOI), silicon-on sapphire (SOS), doped, and undoped semiconductors. In addition, structure can be understood to include epitaxial layers of silicon supported by a base semiconductor foundation. The base semiconductor foundation is typically the lowest layer of silicon material on a wafer or a silicon layer deposited on another material.

The semiconductor need not be silicon-based. For example, the semiconductor can be silicon-germanium, germanium, or gallium-arsenide. When reference is made to "wafer" and "substrate" in the following description, previous process steps may have been utilized to form regions or junctions in or on the semiconductor structure and/or foundation.

As used herein, "layer" can refer to a layer formed on a substrate using a deposition process such as an atomic layer deposition (ALD), plasma deposition, and/or chemical vapor deposition (CVD) process. The term "layer" is meant to include layers specific to the semiconductor industry, such as "barrier layer", "dielectric layer", and "conductive layer". The term "layer" is also meant to include layers found in technology outside of semiconductor technology, such as coatings on glass.

Figure 1A:
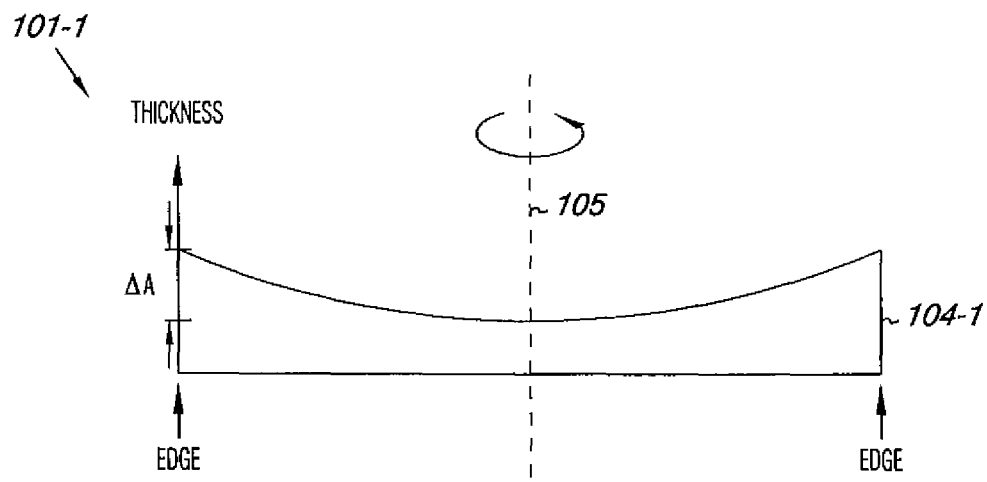
FIG. 1A illustrates a thickness profile of a material layer formed on a semiconductor wafer during an ALD process having a CVD component.

FIG. 1A illustrates a thickness profile of a material layer formed on a semiconductor wafer. The illustration 101-1 of FIG. 1A illustrates a thickness profile of a material layer 104-1 formed on a semiconductor wafer during an ALD process having a CVD component. As shown in FIG. 1A, the material layer 104-1 has a non-uniform thickness profile, e.g., the material layer 104-1 is thicker at the edges of the wafer than at the center 105. The difference between the maximum and minimum thickness of a material layer, e.g., the thickness variance, can be used as a measure of WIW uniformity. For example, a larger thickness variance of a particular layer indicates the layer has a lesser WIW uniformity than a layer having a smaller thickness variance of the material layer. In FIG. 1A, the thickness variance of layer 104-1 is indicated by $\Delta A$.

In one or more embodiments, the WIW uniformity of a material layer, e.g., layer 104-1, can be determined based on a measured thickness of a wafer at a number of different points of the wafer. In such embodiments, the WIW uniformity can be defined as the difference between a maximum thickness measurement and a minimum thickness measurement divided by an average of the number of thickness measurements, e.g., (maximum thickness measurement−minimum thickness measurement)/average thickness measurement). As such, WIW uniformity measurements closer to zero, indicate a wafer having a more uniform thickness profile. The number of measured points used to determine the WIW uniformity can be 9, 13, 25, or 49 points, among others. In this manner, wafers determined to have a larger measured WIW uniformity can be said to have an increased WIW uniformity variance, e.g., an increased WIW non-uniformity.

In various embodiments of the present disclosure, the material layer, e.g., 104-1, can include, for example, an oxide layer such as $Al_2O_3$, $TiO_2$, $ZrO_2$, $HfO_2$, $Ta_2O_5$, $Nb_2O_5$, $CeO_2$, $SiO_2$, $In_2O_3$, or $IrO_2$. The material layer, e.g., 104-1, can also be a composite oxide layer, a nitride layer, a complex nitride layer, a metal layer, or a silicide layer. Embodiments of the present disclosure are not limited to a particular type of material layer, i.e., the above list is not exhaustive.

Figure 1B:
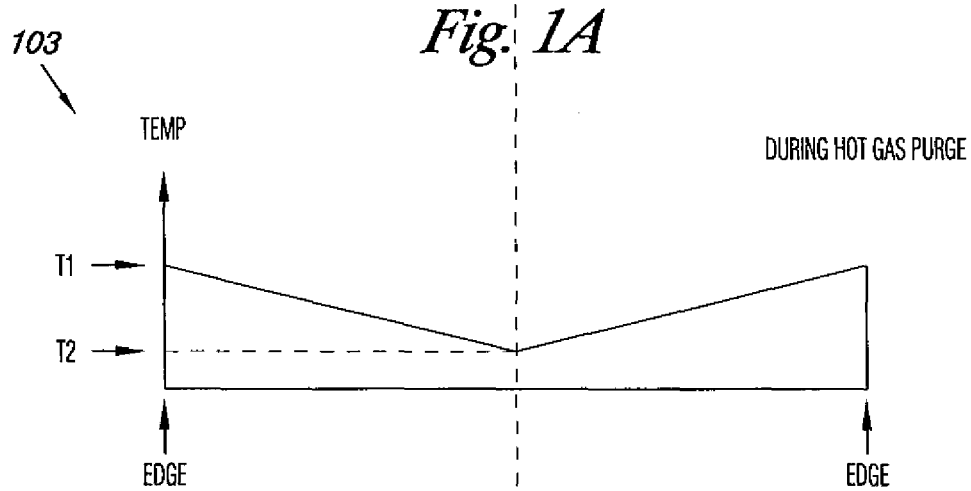
FIG. 1B illustrates the temperature of a purge gas introduced into a reaction chamber during a purge process according to an embodiment of the present disclosure.
Figure 1C:
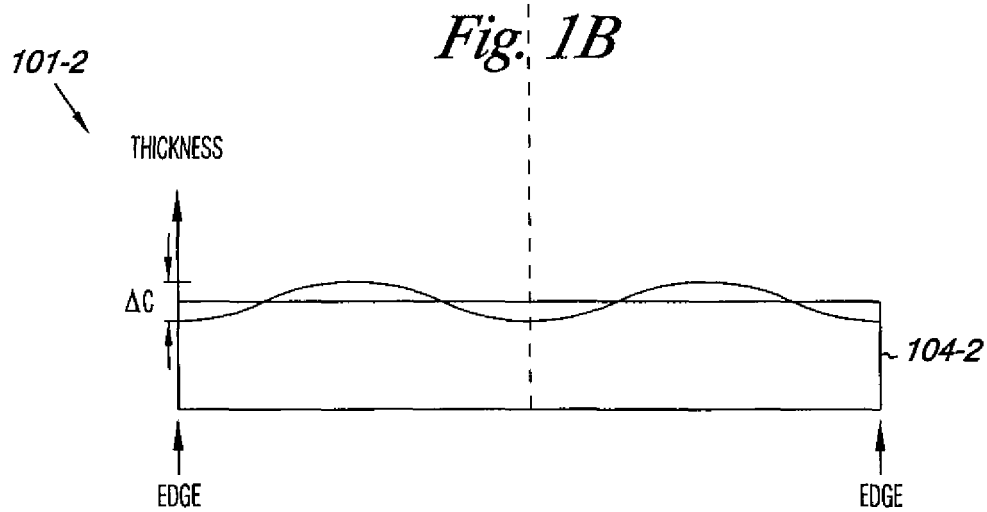
FIG. 1C illustrates a thickness profile of a material layer formed on a semiconductor wafer during an ALD process according to an embodiment of the present disclosure.

In the illustrations shown in FIGS. 1A-1C, the wafers are rotated about their centers 105 during deposition of a material layer, e.g., 104-1. However, embodiments of the present disclosure are not limited to wafers which are rotated during processing.

The non-uniform thickness profile, e.g., edge-thick profile, of material layer 104-1 shown in FIG. 1A can be the result of various factors. For example, the edge-thick profile can be the result of reactant gradients associated with the direct reaction between an amount of residual first reactant and a subsequent pulse of a second reactant in a deposition chamber. That is, in an ALD process, a residual amount of the first reactant after a purge process can react with the subsequently introduced second reactant.

In such cases, the associated reaction rate, e.g., deposition rate, decreases as the second reactant moves across the deposition surface, e.g. the concentration of residual first reactant decreases as the residual amount of first reactant reacts with the second reactant as the second reactant moves from the edge of the wafer toward the center 105. The reactant gradient, e.g., the decreasing reaction rate toward the center, can lead to an edge-thick material layer profile such as that shown in FIG. 1A. A similar effect can occur when an amount of residual second reactant remains in the chamber after a second purge process. That is, the residual amount of the second reactant after a purge process can react with a subsequently introduced pulse of first reactant. As one of ordinary skill in the art will appreciate, a residual amount of reactant can refer to an amount of an ALD reactant pulse that remains unreacted with, e.g., non-adsorbed to, the deposition surface and/or remains in the chamber after a purge process.

As used herein, a purge process refers to a process used to remove an amount of residual reactant from a reaction chamber. A purge process can include one or more purge steps in which a purge gas, e.g., an inert gas, is introduced into the reaction chamber and one or more pumping steps preceding and/or following introduction of the purge gas to remove excess reactant, catalyst, purge gas, and/or by-product gases from the chamber.

As noted above, performing batch processes, lowering the process temperature, and/or shortening pump/purge times can lead to an added CVD component associated with an ALD process, which can increase the deposition rate and/or throughput of the process. However, the increased throughput can lead to an increase in WIW uniformity variance associated with the material layer, e.g., 104-1, for the reasons stated above. For example, an added CVD component associated with the ALD process can result in an edge-thick or "bowl" shaped profile as illustrated in FIG. 1A.

FIG. 1B illustrates the temperature of a purge gas introduced into a reaction chamber during a purge process according to an embodiment of the present disclosure. The illustration 103 of FIG. 1B shows a gas temperature profile from the wafer edges, e.g., EDGE, to a center 105 of the wafer. In various embodiments and as described further below, the temperature at which the purge gas is introduced into the chamber is different than the process temperature of the chamber. In one or more embodiments, and as shown in FIG. 1B, the temperature at which the purge gas is introduced into the chamber e.g., T1 as shown in FIG. 1B, is greater than the process temperature of the chamber. In one or more embodiments, the temperature T1 can be within a range of about 5° C.-25° C. greater than the process temperature, which can be within a range of about 50° C.-100° C., in some embodiments. As an example, in some embodiments, a layer of silicon oxide is deposited on a wafer at a process temperature of about 65° C.-90° C. In such embodiments, the heated purge gas can be in the range of about 70° C.-110° C. However, embodiments of the present disclosure are not limited to a particular material layer, process temperature range, and/or to a particular purge gas temperature range.

In various embodiments, the process temperature of the chamber can be maintained at a steady temperature during deposition of a material layer upon wafer. For example, one or more heating elements internal and/or external to a reaction chamber can be used to maintain a reaction chamber and/or batch of semiconductor wafers at a steady process temperature while the deposition surface of the wafers are exposed to sequentially introduced reactants.

In embodiments in which the purge gas is introduced at a temperature greater than the process temperature, the temperature of the purge gas decreases as the purge gas progresses from an edge of the wafer toward the center 105 of the wafer. In the example shown in FIG. 1B, the purge gas temperature decreases from a first temperature T1 to a second temperature T2 as the purge gas progresses toward the center 105.

In one or more embodiments, the purge gas establishes a temperature differential substantially between an edge of the wafer and a center, e.g., 105, of the wafer. That is, the purge gas having a temperature greater than the process temperature of the reaction chamber can create a temperature differential across the deposition surface of the wafer as the heated purge gas cools, e.g., from T1 to T2, as it moves over the deposition surface.

In some embodiments of the present disclosure, the temperature differential across the wafer results in a non-uniform deposition rate across the wafer. For instance, the deposition rate near the edge of the wafer, which is hotter than the process temperature due to the purge gas, is slower than the deposition rate near the center, e.g., 105, of the wafer, which is cooler than the edge of the wafer due to the introduction of the heated purge gas.

In prior ALD processes, creating a temperature differential across a wafer during processing is discouraged because the temperature differential leads to non-uniform deposition rates, e.g., the deposition rate of the material layer can be slower at portions of the deposition surface which are hotter than at portions of the deposition surface which are cooler. That is, in various prior ALD processes, a uniform temperature across the deposition surface is desirable in order to achieve a uniform deposition rate, e.g., uniform thickness, across the wafer.

The illustration 101-2 of FIG. 1C shows a thickness profile of a material layer 104-2 formed on a semiconductor wafer during an ALD process according to an embodiment of the present disclosure. The material layer 104-2 shown in FIG. 1C has a more uniform thickness profile as compared to the edge-thick profile of material layer 104-1 shown in FIG. 1A. That is, the thickness variance $\Delta C$ of material layer 104-2 is smaller than the thickness variance $\Delta A$ of material layer 104-1 shown in FIG. 1A.

As described above, the edge-thick profile of material layer 104-1 shown in FIG. 1A can be indicative of the presence of a CVD component associated with the ALD process used to form layer 104-1. As described further herein, various processing embodiments of the present disclosure can be used to increase the throughput associated with an ALD process while maintaining a suitable WIW uniformity by using a purge gas heated to a temperature other than the process temperature to compensate for WIW uniformity variance due to the CVD component. In one or more embodiments, the purge gas is heated to a temperature greater than the process temperature in order to decrease the WIW uniformity variance, e.g., in order to decrease the difference $\Delta C$ to a desired level. Some embodiments can allow a suitable WIW uniformity to be achieved even when the CVD component associated with an ALD process is purposely increased.

The material layer 104-2 can represent a material layer formed via an ALD process having the same CVD component presence as that associated with deposition of material layer 104-1. That is, the material layer 104-2 represents a material layer formed in accordance with a processing embodiment of the present disclosure which compensates for the CVD component, e.g., reduces the edge-thick profile and/or thickness variance $\Delta A$ associated with material layer 104-1 shown in FIG. 1A.

Figure 2:
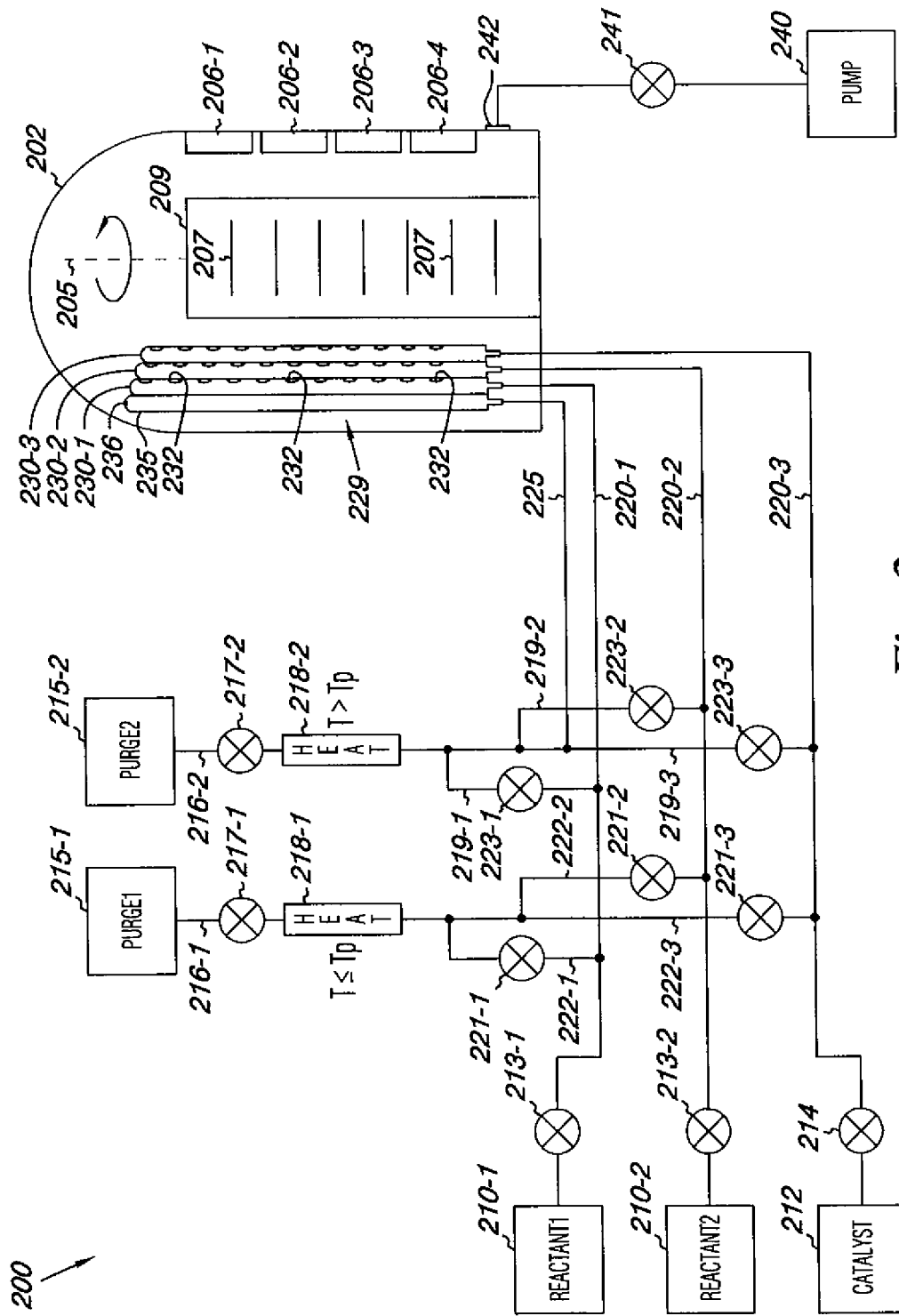
FIG. 2 illustrates a diagram of a semiconductor processing system according to an embodiment of the present disclosure.

FIG. 2 illustrates a diagram of a semiconductor processing system 200 according to an embodiment of the present disclosure. The system 200 includes a reaction chamber 202 (which is sometimes referred to as a deposition chamber) that includes a wafer carrier 209, or boat, which can be loaded into and removed from the chamber 202. The carrier 209 can hold a number of semiconductor wafers 207, e.g., a batch, upon which a material layer is to be formed. As noted above, the material layer can be an oxide layer, a composite oxide layer, a nitride layer, a complex nitride layer, a metal layer, or a silicide layer, among various other material layer types.

The wafers 207 can be vertically stacked and spaced apart from each other in the carrier 209 and can be rotated about their centers 205 during processing. Although the system 200 illustrates a vertical reaction chamber 202 for processing a vertically stacked batch of wafers 207 rotated about their centers 205, embodiments are not limited to batch deposition processes, to vertical chambers, to rotating wafers, or to a particular orientation of the semiconductor wafers within the chamber.

The reaction chamber 202 and/or the wafers 207 can be heated to a desired process temperature (Tp) via a number of heaters 206-1, 206-2, 206-3, and 206-4. Although the chamber 202 includes four heaters, embodiments can include more or fewer heaters. The system 200 includes a pump 240 which can be used to remove residual, e.g., excess, gas such as residual reactant gas, catalyst, purge gas, and/or by-products from the chamber 202 through evacuation port 242. The pump 240 is coupled to a flow controller 241 which can be used to control the exhaust rate through port 242. In the embodiment shown in FIG. 2, the evacuation port 242 is located near a bottom portion of chamber 202. However, in some embodiments, the evacuation port 242 can be located at other locations of reaction chamber 202 and/or the reaction chamber 202 can include multiple evacuation ports.

In various embodiments, and as shown in FIG. 2, the reaction chamber 202 includes an injector assembly 229 through which materials can be introduced into the chamber 202. In the embodiment illustrated in FIG. 2, the injector assembly 229 includes a number of injectors 230-1, 230-2, 230-3, and 235. In the embodiment shown in FIG. 2, the assembly 229 includes four vertical injectors 230-1, 230-2, 230-3, and 235. However, embodiments of the present disclosure are not limited to a particular number of injectors or to vertical injectors.

The vertical injectors 230-1, 230-2, and 230-3 are elongate multi-holed injectors each having a number of apertures 232 along their respective lengths. The number, size, and/or orientation of the apertures 232 can depend on a number of factors such as one or more process parameters associated with the deposition of a material layer on the batch of wafers 207, the type of material layer being deposited, etc.

In various embodiments, a semiconductor processing system can include an injector for introducing purge gas into an upper portion of the reaction chamber and/or for delivering purge gas toward an upper surface of the chamber. In the embodiment illustrated in FIG. 2, the injector assembly 229 includes at least one vertical injector 235 having an aperture 236 at its end, e.g., at its tip as shown. As described further below, the aperture 236 of injector 235 can be used to deliver gas toward an upper portion, e.g., an upper surface, of the chamber 202 during various deposition process stages. For instance, during a purge process, an amount of purge gas, heated to the temperature greater than the process temperature, can be delivered toward an upper surface of the chamber 202. The upper surface of the chamber 202 can include a higher concentration of excess reactant and/or catalyst than other portions, e.g., the side walls, of the chamber 202 due to factors such as the distance between the upper surface and the evacuation port 242 and the relatively large surface area of the upper surface, among other factors.

A higher concentration of residual gases toward the top of the chamber, e.g., additional CVD component, can lead to increased WIW uniformity variance of wafers near the top of the batch. That is, an edge-thick profile can be more pronounced and/or the thickness variance, e.g., variance ΔA shown in FIG. 1A, of the deposited material layer can be greater for wafers 207 near the top of the batch than for lower wafers 207. An example of WIW uniformity variance versus position within a carrier, e.g., carrier 209, for a batch of wafers is illustrated in the graph shown in FIG. 3A.

As described in connection with FIGS. 3A and 3B below, in one or more embodiments, introducing a heated purge gas into an upper portion of the reaction chamber 202 can decrease WIW uniformity variance among wafers in carrier 209. For example, a heated purge gas delivered toward the upper portion of the chamber 202 via injector 235 can be used to compensate for the increased WIW uniformity variance associated with the wafers near the top of the batch, which can increase process throughput. For instance, compensating for the increased WIW uniformity variance associated with wafers near the top of the batch can increase the likelihood that the entire batch of wafers has a suitable WIW uniformity. The heated purge gas delivered toward the top of the chamber 202 via injector 235 creates a temperature differential across the wafers 207 nearest the upper portion of the chamber as it progresses toward the center 205. The heated purge gas becomes less effective, e.g., has less of an effect on the deposition rate of the material layer, as it cools toward the process temperature, e.g., through heat dissipation as it moves from the injection aperture 236 downward in the chamber 202.

That is, the temperature differential across the top wafer 207 is greater than the temperature differential across the surface of a next lower wafer, etc. until the heated purge gas reaches the process temperature. As such, in one or more embodiments, heated purge gas delivered toward the upper portion of the chamber 202 via injector 235 creates a temperature differential across only the top few wafers 205 of the batch. As discussed above in connection with FIGS. 1A-1C, the temperature differential across the surface of a wafer can cause a decrease in deposition rate at the edges in order to compensate for an edge-thick profile due to a CVD component associated with the ALD process.

In some embodiments, the injector 235 includes only an aperture, e.g., 236, at its end. Embodiments are not so limited. For instance, in some embodiments, the injector 235 can include multiple apertures located at or near its tip and/or along its length. In some embodiments, the injector 235 can have a curved shape. In such embodiments, the curved end of the injector 235 can be used to introduce heated purge gas into an upper portion of the chamber 202.

Various system embodiments can include a number of gas sources, e.g., reactant gas sources, catalyst gas sources, purge gas sources, and carrier gas sources. In the embodiment illustrated in FIG. 2, the system 200 includes two reactant sources 210-1 and 210-2, a catalyst source 212, and two purge sources 215-1 and 215-2 which can be delivered, via one or more conduits, e.g., gas lines, to the injector assembly 229 for introduction into the chamber 202.

In the system 200, a first reactant (REACTANT1), a second reactant (REACTANT2), and a catalyst are delivered to the assembly 229 from respective sources 210-1, 210-2, and 212 through respective gas lines 220-1, 220-2, and 220-3 and are introduced into the chamber 202 via respective injectors 230-1, 230-2, and 230-3. The gas flow from sources 210-1, 210-2, and 212 is controlled by respective flow controllers 213-1, 213-2, and 214. As discussed in connection with FIG. 3 below, in embodiments in which the material layer to be deposited on the wafers is silicon oxide ($SiO_2$), REACTANT1 can be hexachlorodisilane ($Cl_6Si_2$), REACTANT2 can be water ($H_2O$), and pyridine ($C_5H_5N$) can be used as the reaction catalyst. In such embodiments, nitrogen gas ($N_2$) can be used as a carrier gas source for delivering the reactants to the chamber 202.

In the embodiment illustrated in FIG. 2, the system 200 includes a first purge gas (PURGE1) and a second purge gas (PURGE2) that can be delivered to the assembly 229 from respective sources 215-1 and 215-2 through respective gas lines 216-1 and 216-2. The flow rate of purge gas through the gas lines 216-1 and 216-2 can be controlled via flow controllers 217-1 and 217-2, respectively. The gas lines 216-1 and 216-2 are coupled to respective heating elements 218-1 and 218-2 which can be used to heat purge gas delivered from respective sources 215-1 and 215-2 to the assembly 229. Example purge gases include, but are not limited to, nitrogen gas and/or argon gas.

In the embodiment illustrated in FIG. 2, only gas lines 216-1 and 216-2 are shown as being coupled to heating elements, e.g., 218-1 and 218-2, respectively. As one of ordinary skill in the art will appreciate, other gas lines, e.g., 219-1, 219-2, 219-3, 220-1, 220-2, 220-3, may also be coupled to heating elements.

In some embodiments, the source 215-1 and/or 215-2 can be both a source of purge gas and a source of carrier gas. That is, carrier gas lines (not shown) from source 215-1 and/or source 215-2 can be coupled to source 210-1, 210-2, and/or 212. However, in some embodiments, the system 200 can include a separate carrier source, e.g., a source separate from sources 215-1 and 215-2, which can be used as the carrier source.

In the embodiment illustrated in FIG. 2, the heating element 218-1 is used to heat purge gas line 216-1 to a temperature (T) which is not greater than, e.g., is less than or equal to, a process temperature (Tp) associated with the particular deposition process. The heating element 218-2 is used to heat purge gas line 216-2 to a temperature which is greater than the process temperature (Tp). Purge gas having a temperature greater than the process temperature of the chamber, e.g., 202, can be referred to herein as "hot purge gas," while purge gas having a temperature at or below the process temperature of the chamber can be referred to herein as "cold purge gas." In some embodiments, the purge gas line 216-2 is heated to a temperature at least 5° C. greater than Tp. In some embodiments, the purge gas line 216-2 is heated such that the hot purge gas PURGE2 is about 5° C.-25° C. greater than the process temperature within the chamber 202. Embodiments are not limited to the above examples. For instance, in some embodiments, the purge gas line 216-2 is heated such that the hot purge gas PURGE2 is more than 25° C. greater than the process temperature within the chamber 202.

The gas line 216-1 has a number of associated gas lines 222-1, 222-2, and 222-3 which are connected to, e.g., are in fluid communication with, respective gas lines 220-1, 220-2, and 220-3 for delivering cold purge gas PURGE1 from source 215-1 to injectors 230-1, 230-2, and 230-3, respectively. The flow of PURGE1 through gas lines 222-1, 222-2, and 222-3 can be controlled with respective flow controllers 221-1, 221-2, and 221-3.

The gas line 216-2 has a number of associated gas lines 219-1, 219-2, and 219-3 which are connected to, e.g., are in fluid communication with, respective gas lines 220-1, 220-2, and 220-3 for delivering hot purge gas PURGE2 from source 215-2 to injectors 230-1, 230-2, and 230-3, respectively. The flow of PURGE2 through gas lines 219-1, 219-2, and 219-3 can be controlled with respective flow controllers 223-1, 223-2, and 223-3.

The gas line 216-2 also has an associated gas line 225 which can be used to deliver PURGE2 from source 215-2 to the injector assembly 229 for introduction of the purge gas into chamber 202 via injector 235. As described further below, in some embodiments purge gas PURGE2, heated to a temperature greater than the process temperature (Tp), can be introduced into the chamber 202 through each of the injectors 230-1, 230-2, 230-3, and 235 during one or more purge processes associated with deposition of a material layer on the batch of wafers 207.

In some embodiments, an amount of hot purge gas PURGE2 can be introduced into the chamber 202 during one or more reactant pulses. For instance, in such embodiments, an amount of PURGE2 can be flowed into the chamber 202 along with a pulse of REACTANT1 and/or along with a pulse of REACTANT2.

In some embodiments, hot purge gas can be used to perform a chamber cleaning process, e.g., a bake out, in between deposition processes. As one of ordinary skill in the art will appreciate, a bake out process can be performed to remove unwanted reactant, catalyst, and/or by-products which may have formed a layer of film on the chamber side walls and upper surface during the deposition process. In such embodiments, hot purge gas can be flowed into the chamber via one or more of the injectors 230-1, 230-2, 230-3, and 235 while the boat 209 is being reloaded with a subsequent batch of wafers 207. In various embodiments, the hot purge gas used for the cleaning process can be hotter than the hot purge gas used for the purge processes. In some embodiments, the hot purge gas has a temperature of about 150° C.-250° C., e.g., the purge gas line 216-2 is heated to a temperature of about 150° C.-250° C. via heating element 218-2.

Using a hot purge gas, e.g., PURGE2, to perform a bake out process can provide several benefits. For instance, performing the bake out with the hot purge gas can reduce or prevent the use of chamber heaters, e.g., 206-1, 206-2, 206-3, and 206-4, to perform the bake out process. Using the chamber heaters 206-1, 206-2, 206-3, and 206-4 to heat the chamber 202 for a bake out process can decrease processing throughput by increasing the time associated with performing the bake out process. For example, it can be difficult to quickly reduce the temperature of the heaters from the elevated bake out temperature to the appropriate process temperature for a subsequent deposition process. Also, it can be difficult to controllably cool the heaters 206-1, 206-2, 206-3, and 206-4 from the elevated temperature to the process temperature since the heaters may cool at different rates. In embodiments in which hot purge gas is used to perform the bake out, the bake out process can be performed with the chamber heaters held at or near the process temperature of the chamber, which can reduce the time associated with cooling the chamber heaters.

In embodiments in which hot purge gas is used to perform the bake out, the processing system, e.g., system 200, may include a separate gas source and/or separate gas lines heated to the elevated bake out temperature to deliver the heated bake out gas to the chamber. For instance, the system 200 can include an additional purge gas line heated to a temperature greater than the process temperature, e.g., a gas line in addition to 216-1 and 216-2 shown in FIG. 2. In such embodiments, the additional heated gas line can allow switching between the hot purge gas used to perform a bake out process and the hot purge gas, e.g., PURGE2, used to perform purge processes according to one or more embodiments of the present disclosure.

As discussed above in connection with FIGS. 1A-1C, in various embodiments of the present disclosure, at least one purge process performed after a reactant pulse includes creating a temperature differential across the deposition surface of a number of the wafers 207 by directing an amount of purge gas, e.g., an amount of hot purge gas PURGE2 across the deposition surface of the number of wafers. The amount of hot purge gas PURGE2 can be introduced into the chamber 202 through one or more injectors, e.g., 230-1, 230-2, 230-3, and 235.

In some embodiments, a first portion of the amount of hot purge gas PURGE2 introduced into the chamber 202 during a purge process is delivered through one or more vertical injectors, e.g., 230-1, 230-2, and/or 230-3, configured to direct the first portion through a number of apertures toward a center 205 of the wafers 207. In some embodiments, a second portion of the amount of hot purge gas PURGE2 introduced into the chamber 202 during a purge process is delivered through a vertical injector, e.g., 235, configured to direct the second portion through an aperture at an end of the second vertical injector, e.g., aperture 236, toward an upper surface of the chamber 202. As described below in connection with FIGS. 3A and 3B, the amount of hot purge gas PURGE2 can be directed toward the upper surface of the chamber 202 in order to decrease WIW uniformity variance associated with wafer position within a boat for a batch of wafers.

In one or more embodiments in which an amount of hot purge gas, e.g., PURGE2, is introduced into the reaction chamber 202, the temperature of the hot purge gas decreases as the purge gas progresses from an edge of the wafer 207 toward the center 205 of the wafer 207. For instance, as shown in the example of FIG. 1B, the hot purge gas temperature decreases from a first temperature, e.g., T1 as shown in FIG. 1B, to a second temperature, e.g., T2 as shown in FIG. 1B, as the purge gas progresses toward the centers 205 of the wafers 207. The cooling of the hot purge gas as the gas moves across the deposition surface of the wafers 207 creates a temperature differential between the edge of the wafers 207 and the center 205. The temperature differential across the wafer 207 results in a non-uniform deposition rate, e.g., a deposition rate gradient, across the wafer 207. In various embodiments, the deposition rate associated with the wafers 207 is slower at the edges of the wafers, where the deposition surface is hottest due to the hot purge gas, and is faster near the center of the wafers, where the deposition surface is at a temperature between the process temperature and the temperature of the edges of the wafers 207.

As described above in connection with FIGS. 1A-1C, establishing a temperature differential across the surface of the wafers 207 by performing a purge process with hot purge gas, e.g., purge gas heated to a temperature greater than the process temperature of the chamber 202 and/or wafers 207, can provide various benefits. For instance, as described above, the temperature differential created by the hot purge gas produces a deposition rate gradient, e.g., the deposition rate is slower at the edges of the wafers 207 than at the center 205 of the wafers 207. As such, the deposition rate gradient established by the hot purge gas can compensate for an edge-thick profile of a material layer, e.g., 104-1 shown in FIG. 1A, associated with the presence of reactant concentration gradients during processing, e.g., the presence of a CVD component associated with the ALD processing method, to produce very low, e.g., near zero, WIW uniformity measurements.

Compensating for WIW uniformity variance, e.g., WIW non-uniformity, associated with the presence of a CVD component in an ALD process can provide improved throughput as compared to prior ALD methods. For example, embodiments of the present disclosure can allow a particular ALD process, e.g., deposition of a particular material layer having a desired thickness and suitable WIW uniformity, to be performed in a shortened amount of time. The deposition time associated with a particular ALD process can be shortened by adjusting various processing parameters which lead to an increase in the presence of a CVD component associated with the ALD process, e.g., an increase in the amount residual reactants between reactant pulses. Examples of processing parameter adjustments which can decrease the deposition time include reducing the amount of pumping and/or purging time between reactant pulses, reducing the number of pumping and/or purging cycles between reactant pulses, increasing the temperature of a reactant source, performing the process at a lower process temperature, and/or flowing an amount of reactant into the chamber during a purge process, among other processing parameter adjustments.

As one of ordinary skill in the art will appreciate, and as described above, an added CVD component associated with an ALD process can increase the deposition rate, e.g., increased throughput, of the ALD process but can cause an increased WIW uniformity measurement, e.g., a more pronounced "bowl" shape profile such as that shown in FIG. 1A. Using embodiments of the present disclosure to compensate for an added CVD component associated with the ALD process can provide the benefits of the increased deposition rate associated with the CVD component while maintaining the WIW uniformity benefits associated with ALD processes.

In various embodiments, the first purge gas PURGE1 and the second purge gas PURGE2 can be the same gas, e.g., nitrogen gas, argon gas, etc. That is, the same type of purge gas can be delivered from first purge gas source 215-1 and second purge gas source 215-2. In such embodiments, providing a separate gas source and/or separate gas line for hot purge gas, e.g., PURGE2, and for cold purge, e.g., PURGE1, can provide several benefits.

For example, as described further below in connection with FIGS. 4, 5, and 6, in various embodiments a purge gas source, e.g., 215-1 and 215-2, can be used as a carrier gas source. In such embodiments, it can be desirable to adjust the temperature of the gas line, e.g., 216-1 and 216-2, during deposition processing. For instance, in various embodiments of the present disclosure, one or more purge processes are performed with a hot purge gas, e.g., a purge gas heated to a temperature above Tp, and one or more reactant pulses are conducted with a cooler purge/carrier gas, e.g., a purge gas heated to a temperature at or below Tp. In such embodiments, it can be difficult to adjust the temperature of a purge gas line to different levels in the time between reactant pulses and purge pulses, which can be on the order of seconds. Therefore, providing one or more separate gas lines for hot purge gas, e.g., purge gas above Tp, and cold purge gas, e.g., purge gas at or below Tp, can allow the system 200 to rapidly switch between using the hot or cold purge gas without increasing processing time due to adjusting the gas line temperature.

Figure 3A:
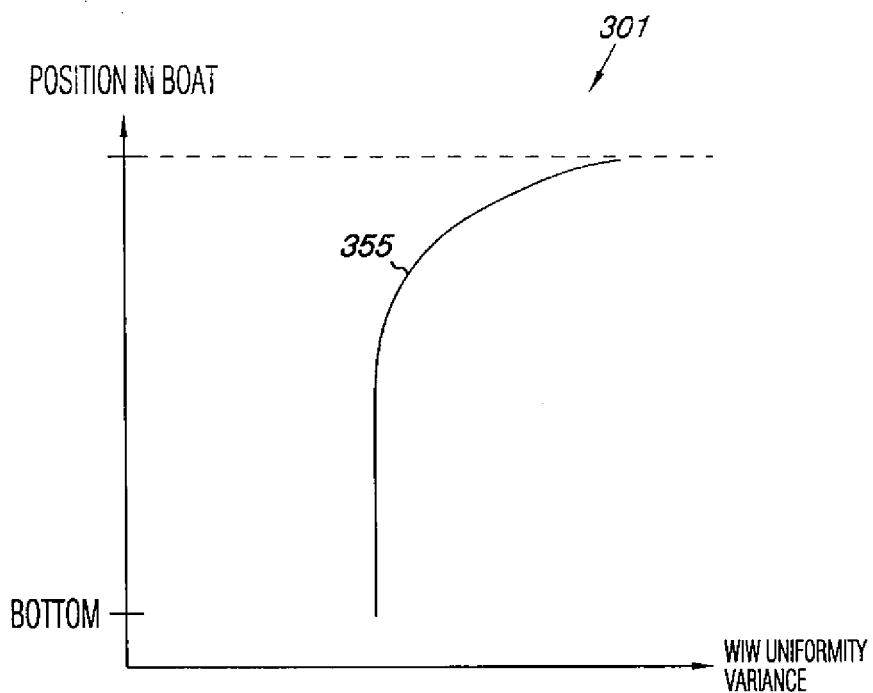
FIG. 3A is a graph illustrating an example of WIW uniformity variance versus position within a boat for a batch of wafers.

FIG. 3A is a graph 301 illustrating an example of WIW uniformity variance versus position within a boat for a batch of wafers. As shown in FIG. 3A, in various semiconductor processing systems, there is some WIW uniformity variance associated with wafer position within a boat, e.g., boat 209 shown in FIG. 2. As an example, the thickness variance, e.g., thickness variance ΔA shown in FIG. 1A, can be greater for wafers at or near the top of the boat than for wafers lower in the boat. For instance, in graph 301, curve 355 illustrates that the WIW uniformity associated with wafers in a boat increases as the wafer position increases. That is, wafers positioned further up in the boat, e.g., at or near the top of the boat, have a greater thickness variance, e.g., a more pronounced "bowl shape" thickness profile as shown in FIG. 1A, than wafers positioned toward the bottom of the boat.

The increased thickness variance, e.g., higher WIW uniformity variance, associated with wafers at the top of a boat can be caused by a higher concentration of excess reactant and/or catalyst on the upper surface of the reaction chamber than on lower portions of the chamber, e.g., chamber sidewalls. The higher concentration of excess reactant and/or catalyst on the upper surface of the reaction chamber can be due to factors such as the distance between the upper surface and the evacuation port 242 and the relatively large surface area of the upper surface, among other factors. The higher concentration of residual gases toward the top of the chamber adds a CVD component to the system which can lead to increased WIW uniformity of wafers near the top of the batch as shown in graph 301.

Figure 3B:
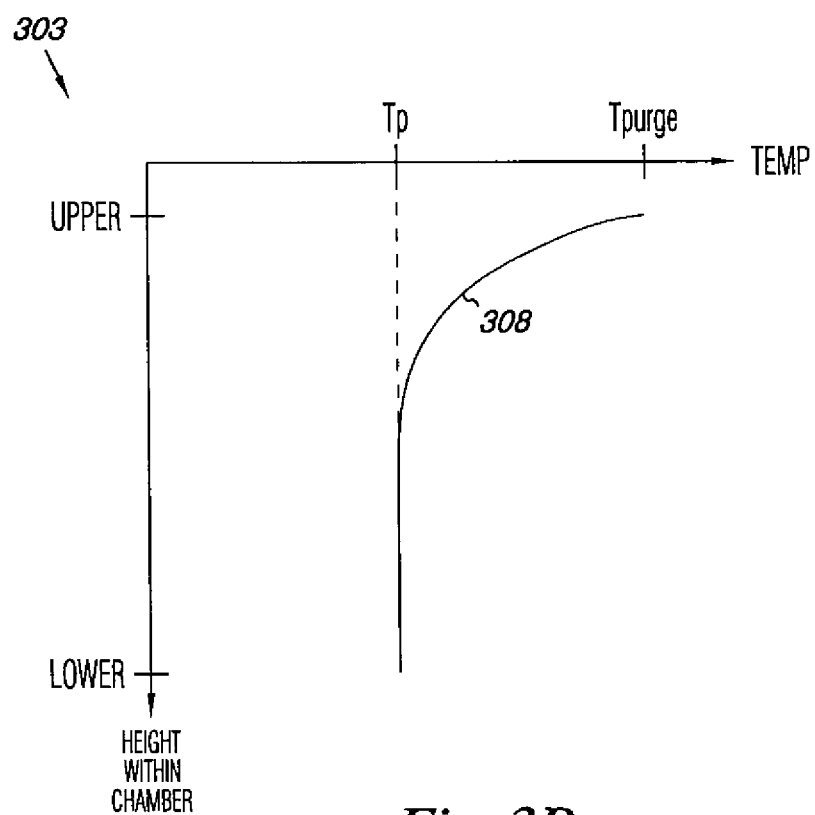
FIG. 3B is a graph illustrating an example of purge gas temperature versus height within a reaction chamber for purge gas introduced into the chamber in accordance with an embodiment of the present disclosure.

FIG. 3B is a graph 303 illustrating an example of purge gas temperature versus height within a reaction chamber for purge gas introduced into the chamber in accordance with an embodiment of the present disclosure. In one or more embodiments, a heated purge gas can be introduced into an upper portion of the reaction chamber, e.g., chamber 202 shown in FIG. 2, in order to decrease WIW uniformity variance among wafers in a boat, e.g., carrier 209 shown in FIG. 2. That is, in some embodiments, introducing the heated purge gas into the upper portion of the chamber can combat the WIW uniformity variance illustrated in graph 301 of FIG. 3A.

In the embodiment shown in graph 303, curve 308 illustrates the temperature of a purge gas introduced into an upper portion of a reaction chamber, e.g., chamber 202 shown in FIG. 2. In this embodiment, the purge gas is introduced into an upper portion of the chamber at a temperature Tpurge which is greater than the process temperature Tp of the chamber. The heated purge gas cools from the temperature Tpurge toward the process temperature Tp as the gas moves from the upper portion (UPPER) to the lower portion (LOWER).

As described in FIG. 2, the heated purge gas can be delivered toward the upper portion of the chamber via an injector, e.g., injector 235 shown in FIG. 2. In such embodiments, the heated purge gas becomes less effective, e.g., has less of an effect on the deposition rate of the material layer, as it cools toward the process temperature Tp, e.g., through heat dissipation as it moves from the introduction point downward in the chamber. As such, in one or more embodiments, heated purge gas delivered toward the upper portion of the chamber creates a temperature differential across only the top few wafers of the batch, e.g., the wafers located nearest the top of the wafer boat, which can have a higher WIW uniformity as compared to wafers located further down in the boat as shown in FIG. 3A.

Figure 4:
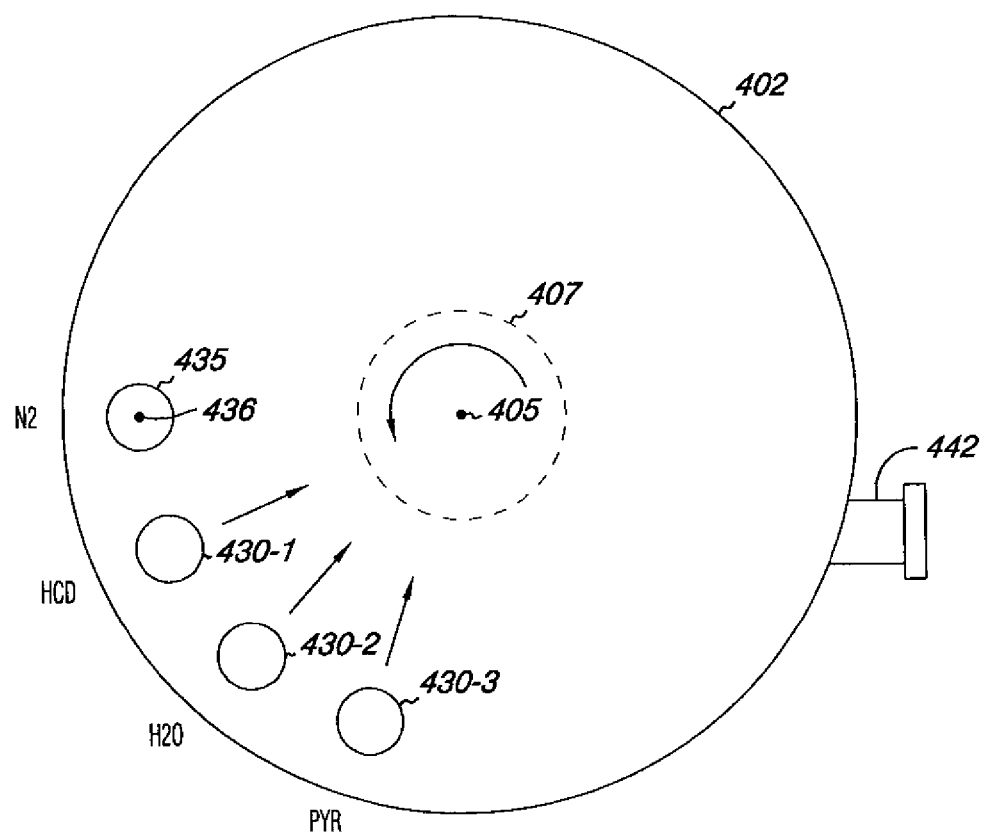
FIG. 4 is an overhead view of a reaction chamber according to an embodiment of the present disclosure.

FIG. 4 is an overhead view of a reaction chamber 402 according to an embodiment of the present disclosure. The reaction chamber 402 includes a number of injectors 430-1, 430-2, 430-3, and 435. The injectors can be vertical injectors such as vertical injectors 230-1, 230-2, 230-3, and 235 shown in FIG. 2. The chamber 402 can include a carrier (not shown), e.g., a wafer boat, into which a number of semiconductor wafers 407 can be loaded to receive a material layer formed thereon. The chamber 402 includes an evacuation port 442 through which residual gas can be removed via a pump, e.g., pump 240 shown in the embodiment of FIG. 2.

As one example, the chamber 402 can be used to form a material layer, e.g., material layer 104-2 shown in FIG. 1C, of silicon oxide ($SiO_2$) on a batch of wafers 407 according to an ALD process embodiment of the present disclosure. In various embodiments, the ALD process can be a catalytic ALD process. In the example discussed in connection with FIG. 4, the material layer of silicon oxide is formed using hexachlorodisilane ($Cl_6Si_2$), or HCD, as a first reactant gas and using water ($H_2O$) as a second reactant gas. In this example, pyridine ($C_5H_5N$), or PYR, is used as the reaction catalyst and nitrogen gas ($N_2$) is used both as a purge gas and as a carrier gas.

In various embodiments, one or more heaters, e.g., 206-1 to 206-4 shown in FIG. 2, can be used to heat the chamber 402 to a suitable process temperature (Tp). As an example, forming a material layer of silicon oxide via the catalytic process described in connection with FIG. 4 can include heating the chamber 402 to a process temperature of about 75° C. The deposition surface of the batch of wafers 407 can then be sequentially exposed to a first reactant gas pulse, e.g., an HCD pulse, via injector 430-1 and a second reactant gas pulse, e.g., a water vapor pulse, via injector 430-2. An amount of catalyst, e.g., pyridine in this example, is flowed into the chamber 402 via injector 430-3 in order to facilitate an increased growth rate, e.g., deposition rate, of the silicon oxide at the 75° C. process temperature as compared to the silicon oxide growth rate via ALD processing at higher process temperatures. As one of ordinary skill in the art will appreciate, a carrier gas such as nitrogen gas can be used to deliver the first and/or second reactant gas to the chamber 409.

In some embodiments, the HCD and $H_2O$ reactants and the pyridine catalyst can be introduced into the chamber 409 at a temperature at or below the process temperature. That is, one or more gas lines used to deliver the reactants and the catalyst can be heated such that the temperature of the gases passing therethrough have a temperature at or below the process temperature, e.g., 75° C. in this example, when introduced into the chamber 409 via the respective injectors 430-1, 430-2, and 430-3. In some embodiments, and as described further below, an amount of purge gas, e.g., nitrogen gas in this example, heated to temperature greater than the process temperature, can be introduced into the chamber along with one or both of the reactant pulses. In such embodiments, the hot purge gas introduced along with the reactant pulse can be used to establish a temperature differential across the surfaces of the wafers.

In various embodiments, a purge process is performed after each reactant pulse. As discussed above, the purge process includes performing one or more pumping and/or one or more purging steps in order to remove excess reactant and/or by-products from the reaction chamber between the sequentially introduced, e.g., separately introduced, reactant pulses. The purging steps involve introducing an amount of purge gas into the chamber and the pumping steps involve evacuating the excess reactant gases, purging gases, and by-product gases from the chamber. The reader will appreciate that an ALD process can be repeated until a desired material layer thickness is deposited on a wafer, e.g., until a desired thickness of silicon oxide is formed on the batch of wafers.

As described above, at least one of the first and second purge process includes creating a temperature differential across the deposition surface of a number of the wafers by directing an amount of purge gas across the deposition surface of the number of wafers. In one or more embodiments, the purge gas is heated to a temperature greater than the process temperature. For instance, in the example shown in FIG. 4, nitrogen gas (N2), heated to a temperature above 75° C., can be introduced into the chamber through one or more of the injectors 430-1, 430-2, 430-3, and 435 during a purge process performed subsequent to an HCD pulse and/or subsequent to an $H_2O$ pulse. As the heated nitrogen purge gas progresses toward the center 405 of the rotating wafers 407, a temperature differential is created across the deposition surface of the wafers 407, e.g., the hot purge gas heats edges of the wafers 407 more than the center 405. In the embodiment illustrated in FIG. 4, the injector 435 is a vertical injector having an aperture 436 for directing hot purge gas toward an upper surface of the chamber 402.

The temperature differential established by the hot purge gas creates a deposition rate gradient which can compensate for an edge-thick profile of a material layer, e.g., 104-1 shown in FIG. 1A, associated with the presence of reactant concentration gradients during processing, e.g., the presence of a CVD component associated with the ALD processing method. As such, one or more embodiments of the present disclosure can provide the benefits of the increased deposition rate associated with the CVD component while maintaining the WIW uniformity benefits, e.g., decreased WIW uniformity measurements, associated with ALD processes.

Although in the example described in connection with FIG. 4 the purge gas directed across the deposition surface of the wafers is heated to a temperature greater than the process temperature of the chamber, embodiments are not so limited. For example, in some ALD reaction systems, the deposition rate associated with the material layer can increase as the temperature increases. As such, in some embodiments, the temperature of the purge gas introduced into the chamber and directed across the deposition surface of the wafer can have a temperature below the process temperature of the chamber. In such embodiments, the temperature of the purge gas will increase as the cool purge gas moves from across the wafer from the edge to the center of the wafer.

Figure 5:
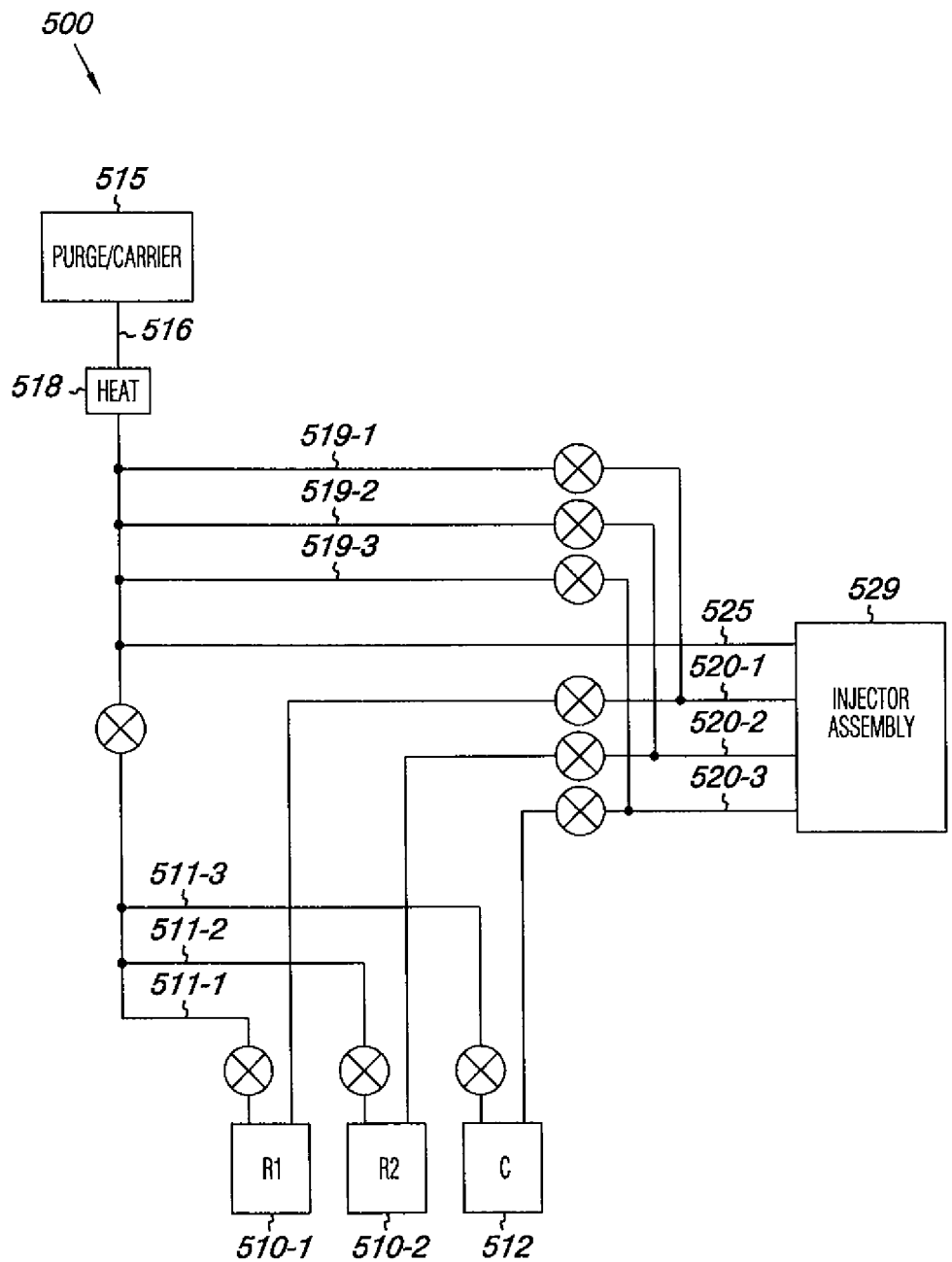
FIG. 5 illustrates a portion of a semiconductor processing system according to an embodiment of the present disclosure.

FIG. 5 illustrates a portion of a semiconductor processing system 500 according to an embodiment of the present disclosure. The system 500 includes an injector assembly 529 for introducing materials into a reaction chamber, e.g., chamber 202 described in FIG. 2. As described above in connection with FIGS. 2 and 4, the injector assembly 529 can include a number of injectors (not shown) coupled to gas lines 520-1, 520-2, 520-3, and 525. In the embodiment illustrated in FIG. 5, the system 500 includes two reactant sources 510-1 and 510-2, a catalyst source 512, and a purge/carrier source 515 which are delivered to the injector assembly 529, via the appropriate gas lines, to the injector assembly 529 for introduction into the chamber.

In the embodiment illustrated in FIG. 5, a first reactant (R1), a second reactant (R2), and a catalyst (C) are delivered to the assembly 529 from respective sources 510-1, 510-2, and 512 through respective gas lines 520-1, 520-2, and 520-3. The system 500 includes a purge/carrier gas (PURGE/CARRIER), e.g., nitrogen gas, that can be delivered to the assembly 529 from gas source 515 through gas line 516. As illustrated in FIG. 5, the gas line 516 is coupled to gas lines 511-1, 511-2, and 511-3 which serve as carrier gas lines for respective sources 510-1, 510-2, and 512.

The gas line 516 has a number of associated gas lines 519-1, 519-2, and 519-3 which are connected to, e.g., are in fluid communication with, respective gas lines 520-1, 520-2, and 520-3 for delivering purge gas PURGE/CARRIER from source 515 to one or more injectors, e.g., injectors 230-1 to 230-3 shown in FIG. 2, of injector assembly 529. The gas line 516 also has an associated gas line 525 which can be used to deliver PURGE/CARRIER from source 515 to one or more injectors, e.g., injector 235 shown in FIG. 2, of injector assembly 529. As described above, the gas line 525 can be coupled to a vertical injector having an aperture only at its end for delivering purge gas toward the upper portion of the chamber.

As illustrated in FIG. 5, the gas line 516 includes a heating element 518 which is used to heat purge gas line 516 to various temperatures during processing. For instance, as described above, in various embodiments, the heating element 518 is used to heat gas line 516 to a temperature which is greater than the process temperature to deliver hot purge gas to the injector assembly 529 via gas lines 520-1, 520-2, 520-3, and/or 525 during a purge process. In various embodiments, the temperature of the gas line 516 is reduced, e.g., to a temperature at or below the process temperature, such that an amount of PURGE/CARRIER used as a carrier gas does not have a temperature greater than the process temperature of the reaction chamber.

In the embodiment illustrated in FIG. 5, only gas lines 516 is shown as being coupled to a heating element, e.g., 518. Other gas lines, e.g., 511-1, 511-2, 511-3, 519-1, 519-2, 519-3, 520-1, 520-2, 520-3, and 525, may also be coupled to heating elements, which can be used to heat the gas lines to various temperatures above and/or below the process temperature associated with the particular ALD process.

In some embodiments, the system 500 can include a separate source for carrier gas and purge gas. For instance, source 515 can be a source of purge gas and the system 500 can include a separate source of carrier gas.

Figure 6:
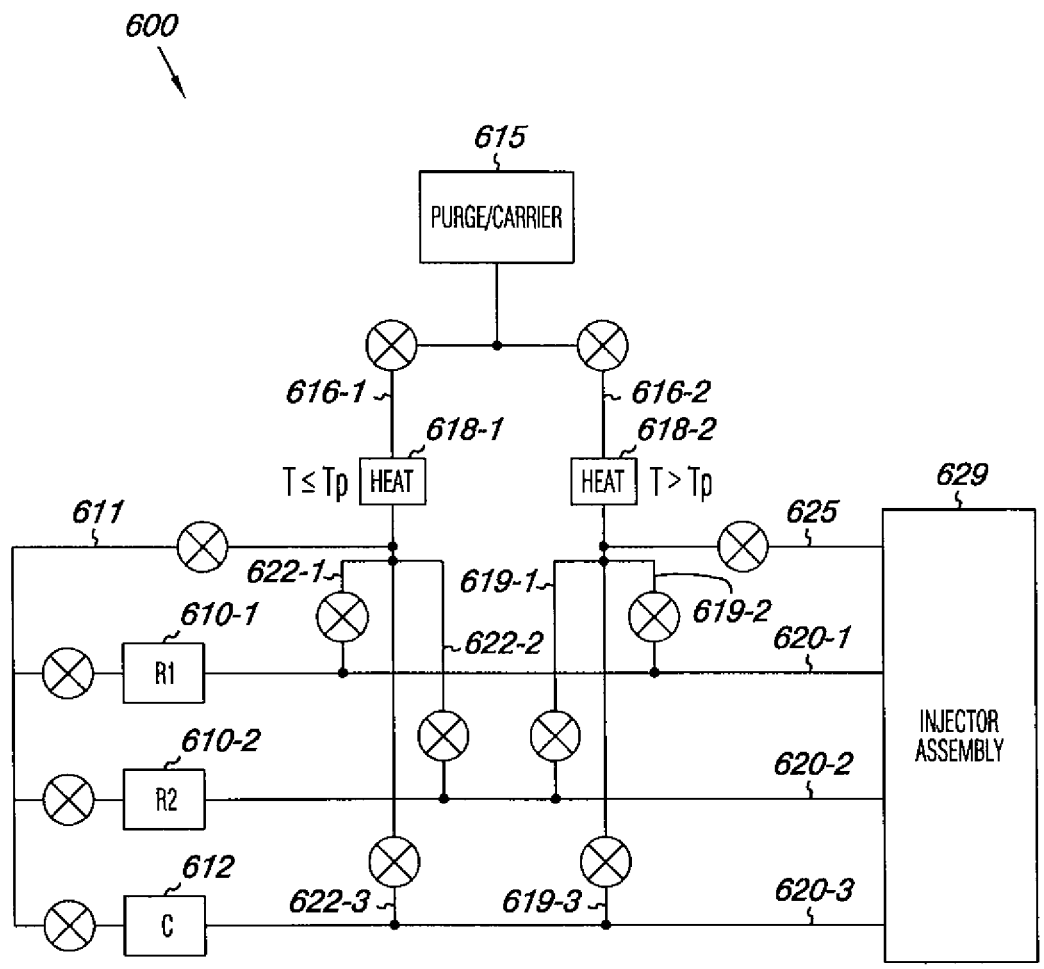
FIG. 6 illustrates a portion of a semiconductor processing system according to an embodiment of the present disclosure.

FIG. 6 illustrates a portion of a semiconductor processing system 600 according to an embodiment of the present disclosure. The system 600 includes an injector assembly 629 for introducing materials into a reaction chamber, e.g., chamber 202 described in FIG. 2. As described above in connection with FIGS. 2 and 4, the injector assembly 629 can include a number of injectors (not shown) coupled to, e.g., in fluid communication with, gas lines 620-1, 620-2, 620-3, and 625. In the embodiment illustrated in FIG. 6, the system 600 includes two reactant sources 610-1 and 610-2, a catalyst source 612, and a purge/carrier source 615 which are delivered to the injector assembly 629, via the appropriate gas lines, to the injector assembly 629 for introduction into the deposition chamber.

In the embodiment illustrated in FIG. 6, a first reactant (R1), a second reactant (R2), and a catalyst (C) are delivered to the assembly 629 from respective sources 610-1, 610-2, and 612 through respective gas lines 620-1, 620-2, and 620-3. The system 600 includes a purge/carrier gas (PURGE/CARRIER), e.g., nitrogen gas, that can be delivered to the assembly 629 from gas source 615 through gas lines 616-1 and/or 616-2. As illustrated in FIG. 6, the gas line 616-1 is coupled to gas line 611 which is coupled to reactant sources 610-1 and 610-2, and to catalyst source 612. That is, in the embodiment of FIG. 6, the PURGE/CARRIER gas delivered from source 615 is used as a purge gas and as a carrier gas.

The gas lines 616-1 and 616-2 are coupled to respective heating elements 618-1 and 618-2 which can be used to heat the PURGE/CARRIER gas delivered from source 615 to the assembly 629. In the embodiment illustrated in FIG. 6, the heating element 618-1 is used to heat gas line 616-1 to a temperature (T) which is not greater than, e.g., is less than or equal to, a process temperature (Tp) associated with the particular deposition process. The heating element 618-2 is used to heat gas line 616-2 to a temperature which is greater than the process temperature (Tp). As used herein, the PURGE/CARRIER gas having a temperature greater than the process temperature of the chamber can be referred to herein as "hot purge gas," while the PURGE/CARRIER gas having a temperature at or below the process temperature of the chamber can be referred to herein as "cold purge gas." In various embodiments, the gas line 616-2 is heated to a temperature at least 5° C. greater than Tp. In some embodiments, the purge gas line 616-2 is heated such that the hot purge gas PURGE/CARRIER is about 5° C.-25° C. greater than the process temperature within the chamber. Embodiments are not limited to the above examples.

The gas line 616-1 has a number of associated gas lines 622-1, 622-2, and 622-3 which are connected to, e.g., are in fluid communication with, respective gas lines 620-1, 620-2, and 620-3 for delivering cold purge gas PURGE/CARRIER from source 615 to one or more injectors, e.g., injectors 230-1 to 230-3 shown in FIG. 2, of injector assembly 629. The gas line 616-2 has a number of associated gas lines 619-1, 619-2, and 619-3 which are connected to, e.g., are in fluid communication with, respective gas lines 620-1, 620-2, and 620-3 for delivering hot purge gas PURGE/CARRIER from source 615-2 to injector assembly 629. The gas line 616-2 also has an associated gas line 625 which can be used to deliver hot purge gas PURGE/CARRIER from source 615 to one or more injectors, e.g., injector 235 shown in FIG. 2, of injector assembly 629.

As noted above, it can be desirable to adjust the temperature of a purge/carrier gas, e.g., PURGE/CARRIER, used during deposition processing. For instance, in various embodiments of the present disclosure, one or more purge processes are performed with a hot purge/carrier gas, e.g., PURGE/CARRIER heated to a temperature above Tp, and one or more reactant pulses are conducted with a cooler purge/carrier gas, e.g., PURGE/CARRIER gas heated to a temperature at or below Tp. In such embodiments, it can be difficult to adjust the temperature of a gas line, e.g., 616-1 and/or 616-2, to different levels in the time between reactant pulses and purge pulses, which can be on the order of seconds. Therefore, providing one or more separate gas lines, e.g., 616-2 for hot purge gas and 616-1 for cold purge gas, can allow the system 600 to rapidly switch between using the hot or cold purge gas without increasing processing time due to adjusting the gas line temperature.

Figure 7:
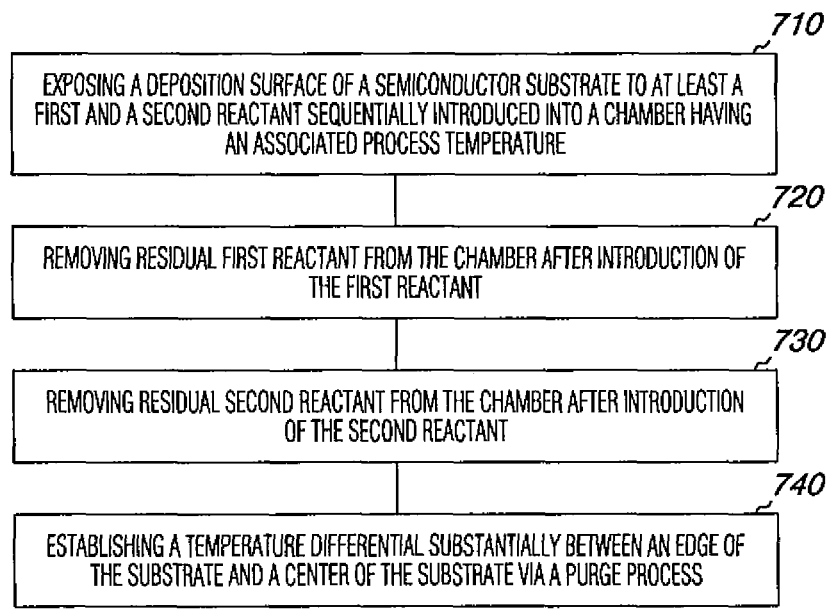
FIG. 7 is a block diagram of a method for semiconductor processing according to an embodiment of the present disclosure.

FIG. 7 is a block diagram of a method for semiconductor processing according to an embodiment of the present disclosure. At block 710, the method includes forming a material layer on a semiconductor substrate by exposing a deposition surface of the substrate to at least a first and a second reactant sequentially introduced into a reaction chamber having an associated process temperature.

In various embodiments, the method includes maintaining the chamber at a steady process temperature while exposing the deposition surface of the wafers to the sequentially introduced first and the second reactants. In some embodiments the process is a catalytic ALD process used to form a material layer of silicon oxide on a batch of wafers.

As shown at block 720, the method includes removing residual first reactant from the chamber after introduction of the first reactant. As shown at block 730, the method includes removing residual second reactant from the chamber after introduction of the second reactant.

As shown at block 740, the method includes establishing a temperature differential substantially between an edge of the substrate and a center of the substrate via a purge process. In one or more embodiments, establishing the temperature differential includes, during the purge process, introducing an amount of purge gas having a temperature different than the process temperature into the chamber.

In various embodiments, the amount of purge gas has a temperature less than the process temperature, and establishing the temperature differential includes delivering the amount of purge gas across a deposition surface of the substrate. In various embodiments, the amount of purge gas has a temperature greater than the process temperature, and establishing the temperature differential includes delivering a first portion of the amount of purge gas across a deposition surface of the substrate.

In embodiments in which an amount of purge gas hotter than the process temperature is delivered across the deposition surface of the substrate, a first portion of the amount of purge gas can be delivered from a gas source through a number of elongate injectors of an injector assembly such that a temperature of the deposition surface of the wafers decreases as the first portion of the amount of purge gas moves from the edge of the substrate toward the center. In embodiments in which an amount of purge gas hotter than the process temperature is delivered across the deposition surface of the substrate, the method can include delivering a second portion of the amount of purge gas having a temperature greater than the process temperature from an injector assembly toward an upper surface of the chamber.

In some embodiments, the method includes heating the amount of purge gas to different temperatures for the first and second purge processes. In some embodiments, the method includes delivering an amount of purge gas heated to a temperature greater than the process temperature into the chamber during introduction of at least one of the first reactant and the second reactant into the chamber, e.g., during a reactant pulse.

One or more of the method embodiments create a temperature differential across a deposition surface of the wafers by introducing a first portion of the amount of purge gas into the chamber through a first vertical injector configured to direct the first portion through a number of apertures along a length of the first vertical injector toward a center of the number of wafers.

In some embodiments, at least one of the first and second purge processes includes introducing a second portion of an amount of hot purge gas into the chamber through a second vertical injector configured to direct the second portion through an aperture at an end of the second vertical injector toward an upper surface of the chamber. As described in connection with FIGS. 2, 3A, and 3B, directing the second portion toward the upper surface of the chamber can decrease a WIW uniformity variance associated with wafers positioned at different locations in a wafer carrier. For instance, introducing a hot purge gas into the upper portion of the chamber can produce a larger reduced thickness variance for wafers toward the top of a wafer boat than for wafers located lower in the wafer boat.

In some embodiments, the method includes using a particular gas source as a purge gas source and as a carrier gas source. In such embodiments, the method can include providing one or more separate gas lines for delivering purge gas heated to a temperature greater than the process temperature to the chamber and for delivering a purge gas heated to a temperature not greater than the process temperature to the reactant sources.

CONCLUSION

Embodiments of the present disclosure include semiconductor processing methods and systems. Various embodiments can improve the throughput of an atomic layer deposition (ALD) process by controlling and/or compensating for one or more chemical vapor deposition (CVD) components associated with the ALD process.

One method includes forming a material layer on a semiconductor substrate by exposing a deposition surface of the substrate to at least a first and a second reactant sequentially introduced into a reaction chamber having an associated process temperature. The method includes removing residual first reactant from the chamber after introduction of the first reactant, removing residual second reactant from the chamber after introduction of the second reactant, and establishing a temperature differential substantially between an edge of the substrate and a center of the substrate via a purge process.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A semiconductor processing system, comprising:
a chamber maintained at a process temperature during an atomic layer deposition process;
a carrier for holding a batch of semiconductor wafers each having a deposition surface to be exposed to at least a first and a second reactant sequentially introduced into the chamber; and
an injector assembly through which an amount of purge gas, heated to a temperature other than the process temperature, is introduced into the chamber during at least one of a first purge process and a second purge process;
wherein the amount of purge gas, heated to the temperature other than the process temperature, creates a temperature differential across the deposition surfaces of the batch of semiconductor wafers to provide a non-uniform deposition rate across the deposition surfaces.

2. The system of claim 1, wherein the injector assembly includes a first vertical injector having a number of apertures along a length of the first vertical injector.

3. The system of claim 2, wherein the injector assembly includes a second vertical injector configured to direct at least a portion of the amount of purge gas through an aperture at an end of the second vertical injector toward an upper surface of the chamber.

4. The system of claim 3, wherein the at least a portion of the amount of purge gas decreases a deposition rate associated with a number of wafers located closer to the upper surface than a number of wafers located farther from the upper surface.

5. The system of claim 1, wherein the amount of purge gas is heated to a temperature greater than the process temperature.

6. The system of claim 1, wherein the system includes:
a first gas line maintained at the temperature greater than the process temperature, the first gas line in fluid communication with a first source of purge gas; and
a separate gas line heated to a temperature not greater than the process temperature, the separate gas line in fluid communication with the first source of purge gas.

7. The system of claim 6, wherein the first gas line and the separate gas line are coupled to a third gas line in fluid communication with the injector assembly.

8. The system of claim 6, wherein the first source of purge gas is used as a carrier gas source for at least one of the first and the second reactant.

9. The system of claim 1, wherein the system includes:
a first gas line maintained at the temperature greater than the process temperature, the first gas line in fluid communication with a first source of purge gas; and
a second gas line maintained at a temperature not greater than the process temperature, the second gas line in fluid communication with a second source of purge gas.

* * * * *